(12) United States Patent
Sager et al.

(10) Patent No.: US 6,852,920 B2
(45) Date of Patent: Feb. 8, 2005

(54) NANO-ARCHITECTED/ASSEMBLED SOLAR ELECTRICITY CELL

(75) Inventors: Brian M. Sager, Palo Alto, CA (US); Martin R. Roscheisen, San Francisco, CA (US)

(73) Assignee: Nanosolar, Inc., Palo Alto, CA (US)

( * ) Notice: Subject to any disclaimer, the term of this patent is extended or adjusted under 35 U.S.C. 154(b) by 0 days.

(21) Appl. No.: 10/319,406

(22) Filed: Dec. 11, 2002

(65) Prior Publication Data

US 2004/0250848 A1 Dec. 16, 2004

Related U.S. Application Data

(60) Provisional application No. 60/390,904, filed on Jun. 22, 2002.

(51) Int. Cl.[7] ............... H01L 31/0352; H01L 31/0256
(52) U.S. Cl. ............ 136/263; 136/255; 136/256; 257/40; 257/465; 257/466; 257/464; 257/461; 438/82; 438/71; 438/88; 438/57
(58) Field of Search ................... 136/263, 255, 136/256; 257/40, 465, 466, 464, 461; 438/82, 71, 88, 57

(56) References Cited

U.S. PATENT DOCUMENTS

| | | | |
|---|---|---|---|
| 5,482,570 A | | 1/1996 | Saurer et al. .......... 136/255 |
| 5,525,440 A | | 6/1996 | Kay et al. .......... 429/111 |
| 5,571,612 A | * | 11/1996 | Motohiro et al. .......... 428/323 |
| 5,674,325 A | * | 10/1997 | Albright et al. .......... 136/250 |
| 5,986,206 A | * | 11/1999 | Kambe et al. .......... 136/263 |
| 5,990,415 A | * | 11/1999 | Green et al. .......... 136/255 |
| 6,075,203 A | * | 6/2000 | Wang et al. .......... 136/256 |
| 6,270,846 B1 | | 8/2001 | Brinker et al. .......... 427/385.5 |
| 6,278,056 B1 | | 8/2001 | Sugihara et al. .......... 136/263 |
| 6,291,763 B1 | * | 9/2001 | Nakamura .......... 136/256 |
| 6,340,789 B1 | | 1/2002 | Petritsch et al. .......... 136/263 |
| 2002/0017656 A1 | | 2/2002 | Graetzel et al. .......... 257/184 |
| 2002/0134426 A1 | | 9/2002 | Chiba et al. .......... 136/263 |
| 2002/0192441 A1 | * | 12/2002 | Kalkan et al. .......... 428/209 |
| 2003/0226498 A1 | | 12/2003 | Alivisatos et al. .......... 117/84 |
| 2004/0118448 A1 | | 6/2004 | Scher et al. .......... 136/252 |

FOREIGN PATENT DOCUMENTS

| | | |
|---|---|---|
| DE | 2741954 | 3/1979 |
| DE | 2741954 A1 * | 3/1979 |
| EP | 1028475 A1 * | 8/2000 |
| EP | 1087446 A2 * | 3/2001 |
| WO | WO 02/084708 | 10/2002 |

OTHER PUBLICATIONS

Merriam Webster Online Dictionary entry for "template" [online], [retrieved on Jul. 16, 2004]. Retrieved from the Internet ,<URL: http://www.m-w.com/cgi-bin/dictionary-?book=Dictionary&va=template>.

Merriam Webster Online Dictionary entry for "include" [online], [retrieved on Jun. 14, 2004]. Retrieved from the Internet ,<URL: http://www.m-w.com/cgi-bin/dictionary-?book=Dictionary&va=include>.

(List continued on next page.)

*Primary Examiner*—Alan Diamond
(74) *Attorney, Agent, or Firm*—Joshua D. Isenberg; JDI Patent (57) ABSTRACT

Nano-architected/assembled solar cells and methods for their manufacture are disclosed. The solar cells comprise oriented arrays of nanostructures wherein two or more different materials are regularly arrayed and wherein the presence of two different materials alternates. The two or more materials have different electron affinities. The two materials may be in the form of matrixed arrays of nanostructures. The presence of the two different materials may alternate within distances of between about 1 nm and about 100 nm. An orientation can be imposed on the array, e.g. through solution deposition surfactant templation or other methods.

38 Claims, 6 Drawing Sheets

OTHER PUBLICATIONS

K. Tennakone et al, "A Dye–Sensitized Nano–Porous Solid–State Photo Voltaic Cell" *Semiconductor Science and Technology,* vol. 10, pp. 1689–1693, IOP Publishing, UK 1995.

U.S. patent application Ser. No. 10/303,665, entitled "Molding Technique for Fabrication of Optoelectronic Devices", to Martin R. Roscheisen et al, filed Nov. 22, 2002.

U.S. patent application Ser. No. 10/290,119, entitled "Optoelectronic Devices and Fabrication Methods" to Brian M. Sager et al, filed Nov. 5, 2002.

M. Granstrom, K. Petritsch, A. C. Arias, A. Lux, M. R. Andersson & R. H. Friend. 1998. Laminated fabrication of polymeric photovoltaic diodes. Nature 395, 257–260, Sep. 1998.

Gebeyehu, D., Brabec, C.J., Saricifti, N.S., Vangeneugden, D., Kiebooms, R., Vanderzande, D., Kienberger, F., and H. Schnindler. 2002. Hybrid Solar Cells based on dye–sensitized nanoporous TiO2 electrods and conjugated polymers as hole transport materials. Synthetic Metals 123, 279–287, (2002).

Greg P. Smestad, Stefan Spiekermann, Janusz Kowalik, Christian D. Grant, Adam M. Schwartzberg, Jin Zhang, Laren M. Tolbert, and Ellen Moons. 2002. A technique to compare polythiophene solid–state dye sensitized TiO2 solar cells to liquid junction devices.Solar Energy Materials & Solar Cells, in press, (date unknown).

Hongyou Fan, Yunfeng Lu, Aaron Stump, Scott T. Reed, Tom Baer, Randy Schunk, Victor Perez–Luna, Gabriel P. Lopez & C. Jeffrey Brinker. 2000. Rapid prototyping of patterned functional nanostructures, Nature 405, 56–60, May 2000.

Alan Sellinger, Pilar M.Weiss, Anh Nguyen, Yunfeng Lu, Roger A. Assink, Weiliang Gong & C. Jeffrey Brinker. 1998. Continuous self–assembly of organic–inorganic nanocomposite coatings that mimic nacre. Nature 394, 256–260, Jul. 1998.

Yunfeng Lu, Rahul Ganguli, Celeste A. Drewien, Mark T. Anderson, C. Jeffrey Brinker, Weilang Gong, Yongxing Guo, Hermes Soyez, Bruce Dunn, Michael H. Huang & Jeffrey I. Zink. 1997. "Continuous formation of supported cubic and hexagonal mesoporous films by sol–gel dip–coating," Nature 389, Sep. 25, 1997.

L. Schmidt–Mende, A. Fechtenkotter, K. Mullen, E. Moons, R. H. Friend, J. D. MacKenzie. 2002. Self–Organized Discotic Liquid Crystals for High–Efficiency Organic Photovoltaics. Science 293, 1119–1122, Aug. 2001.

Wendy U. Huynh, Janke J. Dittmer, A. Paul Alivisatos. 2002. Hybrid Nanorod–PolymerSolar Cells. Science 295, 2425–2427, Mar. 2002.

Thuc–Quyen Nguyen, Junjun Wu, Vinh Doan, Benjamin J. Schwartz, Sarah H. Tolbert. 2000. Control of Energy Transfer in Oriented Conjugated Polymer–Mesoporous Silica Composites. Science 288, 652–656, Apr. 2000.

Heeger, A.J. 2000. Semiconducting and metallic polymers: the fourth and fifth generation of polymeric materials. Synthetic Metals 125, 23–42, (2002).

Michael H. Huang, Amer Choudrey and Peidong Yang, "Ag Nanowire Formation within Mesoporous Silica" *Chem. Commun.,* 2000, 1063–1064.

Andrew A. Gewirth, Panos C. Andricacos, and Jay A. Switzer, with John O. Dukovic, editor "Hot Topics in Electrodeposition", The Electrochemical Society *Interface* • Spring 1998.

Heini Saloniemi, "Electrodeposition of PbS, PbSe and PbTe Thin Films" by Heini Saloniemi, *VTT Publications* 423, Dec. 15, 2000, an electronic copy of which may be accessed at http://www.inf.vtt.fi/pdf/publications/2000/P423.pdf.

Huang Y, Duan, X, Wei, Q, & C.M. Lieber, "Directed Assembly Of One–Dimensional Nanostructures Into Functional Networks" *Science* 291(5504):630–633 (2001).

Byung Hee Hong, Sung Chul Bae, Chi–Wan Lee, Sukmin Jeong, and Kwang S. Kim, "Ultrathin Single–Crystalline Silver Nanowire Arrays Formed in an Ambient Solution Phase", *Science* 294: 348–351; Published online Sep. 6, 2001.

Justin D. Holmes, Keith P. Johnston, R. Christopher Doty, and Brian A. Korgel, "Control of Thickness and Orientation of Solution–Grown Silicon Nanowires" *Science* Feb. 25, 2000; 287: 1471–1473.

Lu, Y., Yang, Y., Sellinger, A., Lu, M., Huang, J., Fan, H., Haddad, R., Lopez, G., Burns, A.R., Sasaki, D.Y., Shelnutt, J., and C. J. Brinker, "Self–Assembly of Mesoscopically Ordered Chromatic Polydiacetylene Nanocomposites", *Nature* 410: 913–917 (2001.)

Halls et al., "Efficient Photodiodes from interpenetrating Polymer Networks", *Nature,* vol. 376 Aug. 10, 1995.

O'Regan et al. "A Low–cost, High–efficiency solar cell based on dye–sensitized colloidal $TiO_2$ Films", *Nature,* vol. 353 pp 737–740, Oct. 24, 1991.

Mapes et al., "Ionic Conductivities of Poly(siloxane) Polymer Electrolytes with Varying Length of Linear Ethoxy Sidechains, Different Molecular Weights, and Mixed Copolymers", *Polymer Preprints,* 41(1), pp 309–310 (2000).

Hooper et al., "A Highly Conductive Solid–State Polymer Electrolyte Based on a Double–Comb Polysiloxane Polymer with Oligo(ethylene oxide) Side Chains", *Organometallics,* vol. 18, No. 17, Aug. 16, 1999.

Nazeeruddin et al. "Conversion of Light to Electricity by $cis$-$X_2$Bis(2,2'–bipyridyl–4,4'–dicarboxylate) ruthenium(II) Charge–Transfer Sensitizers (X = Cl$^-$, BR$^-$, I$^-$, CN$^-$, and SCN$^-$) on Nanocrystalline $TiO_2$ Electrodes", *Journal of the American Chemical Society* 1993, 115, pp 6382–6390 (1993).

Green et al. "Solar Cell Efficiency Tables (*version 11*)", Proges in Photovoltaics: Research and Applications, 6, 35–42 (1998).

Gebeyehu et al, "Solid–State Organic/inorganic Hybrid Solar Cells Based on Conjugated Polymers and Dye–Sensitized $TiO_2$ Electrodes", *Thin Solid Films,* 403–404, pp 271–274 (2002).

Barbé et al., "Nancrystalline Titanium Oxide Electrodes for Photovoltaic Applications", *Journal of the American Ceramic Society,* 80 (12), pp 3157–3171 (1997).

* cited by examiner

NANO-ARCHITECTED/ASSEMBLED SOLAR ELECTRICITY CELL

CROSS-REFERENCE TO AN EARLIER FILED APPLICATION

This application claims priority to U.S. Provisional Patent Application 60/390,904, filed Jun. 22, 2002, the entire disclosures of which are incorporated herein by reference.

FIELD OF THE INVENTION

This invention comprises solar cell devices and methods for their production, and more specifically to nano-architected/assembled solar cells.

BACKGROUND OF THE INVENTION

In the prior art, organic and hybrid solar cells have been fabricated with a polychromatic efficiency of 2% and a peak monochromatic efficiency of 7% (Huynh et al., "Hybrid NanoRod-Polymer Solar Cells", *Science* 295, 2425–2427 (2002); Schmidt-Mende et al., "Self-Organized Discotic Liquid Crystals for High-Efficiency Organic Photovoltaics", *Science* 293, 1119–1122 (2002)). In these solar cell devices, the device architecture is not adequate for that needed for a higher-efficiency device. These devices are limited by the extent to which excitons can be harvested to perform useful work. This is due to three different factors:

First, the nanostructure within the active layer of the solar cells made by other groups were quasi-randomly arranged within a medium of conducting or semiconducting polymer, and, as such, many photons were not converted into excitons. In particular, in the Huynh et al work, since many nanorods were only partially aligned, and large clusters of nanorods (interspersed with areas of few rods) were present in the devices; photonic energy could pass through the device without being incident to an excitonic transformation event. This decreased the efficiency of exciton creation.

Second, of the excitons which did form, many did not reach an electron affinity junction before spontaneously recombining. The lifetime of migrating excitons are extremely short, and as such an exciton can typically travel only 10 nm before the electron and hole spontaneously and non-productively recombine. Thus, to extract the electron away from its bound hole, an exciton must reach a junction of materials with differential electron affinities within 10 nm of the site where the exciton was initially created. In the devices produced by other groups, such as the work of Schmidt-Mende et al. and Huynh et al., the spacing of the nanostructures was quasi-random, and so some areas of the device had many junctions within 10 nm of one another (permitting efficient electron extraction), while many other areas of the device had no junctions at all within 10 nm of one another (resulting in the loss of electrons associated with excitons travelling in those regions of the device). This factor decreased the efficiency of both electron and hole transfer at differential electron affinity junctions.

Finally, the movement of electrons through the active materials of the devices required regularly and closely spaced nanowires or nanorods which could collect and transport free electrons to the outer boundary of the active layer of the device. This factor decreased the hole and electron collection efficiency. All of these factors combine to reduce the device efficiency, and therefore the potential electricity that can be produced by a solar cell.

Thus, there is a need in the art for a solar cell architecture that overcomes the above difficulties.

SUMMARY OF THE INVENTION

The disadvantages associated with the prior art are overcome by a solar cell device architecture wherein two different materials are regularly arrayed and wherein the presence of two different materials alternates within 1 nm to 100 nm distances. The two materials may be arrayed using nanostructures such as filled pores, nanolamellas, or other matrixed nanostructures. The architecture integrates a conducting or semiconducting polymer into a mesoporous substrate to form a base matrix for a nanostructured layer. The architecture may be implemented with a mesoporous template having a conducting or semiconducting polymer or other media containing pores that are filled with a material having a different electron affinity than the surrounding conducting or semiconducting media to create an interdigitated mesh network amongst the conducting or semiconducting polymer media.

According to an embodiment of the present invention, a solar cell comprises an oriented array of semiconducting nanostructured materials in a matrix of conducting or semiconducting polymeric materials. Spacing and size of the components in the solar cell active layer may be chosen to maximize the efficiency of the device. Conductive (or semiconducting) layers may be placed above and/or below the solar cell active region allow for efficient collection of electrons and holes.

Methods for production of solar cells include imposing an orientation or an array of two or more materials having different electron affinities such that the two or more materials are regularly arrayed and the presence of the two or more materials alternates within distances of between about 1 nm and about 100 nm. The orientation may be imposed by techniques including oriented solution deposition into a surfactant-templated, high-porosity polymeric mold structure, electrodeposition, and solution deposition.

In one example, among others, the orientation may be imposed on the array by forming a mesoporous template having an array of pores. Such a mesoporous template may be produced using, e.g., intercalation and/or grafting of organic or polymeric molecules within a mineral lamellar network; synthesis by electrocrystallisation of hybrid molecular assemblies; impregnation of preformed inorganic gels, synthesis from heterofunctional metallic alkoxides or silsesquioxannes, synthesis of hybrid through the connection of well defined functional nanobuilding blocks, templated growth of inorganic or hybrid networks using organic molecules and macromolecules including surfactants, amines, alkyl ammonium ions, or amphiphilic molecules, as structure directing agents, templated growth with nanoparticles followed by removal of the nanoparticles, and bioengineered self-assembly, e.g., self-assembly of protein molecules for use as a deposition template followed by removal of the template using a protease.

DETAILED DESCRIPTION OF THE INVENTION

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In an example of an embodiment of the present invention, arrays of nanoscale structures of conducting or semiconducting materials and conducting or semiconducting polymeric materials are used in an architecture for a highly efficient solar cell device. Other embodiments of the present invention are directed to solar cells and methods for the manufacture thereof, and more particularly, to solar cells comprising oriented nanoscale arrays of nanostructures in a matrix of conducting or semiconducting polymeric materials, where the nanostructures have a different affinity than the conducting or semiconducting polymeric materials. An orientation can be imposed on the array through solution deposition means into a surfactant-templated, high-porosity polymeric mold structure, electrodeposition means, and solution deposition means using an external ordering field such as an electric field.

As used herein "array of nanostructures" refers to a regular arrangement of structures having a size on the order of a few nanometers to several tens of nanometers, where the arrangement exhibits long-range order. As used herein "long range order" means that the array retains its arrangement over a scale of distance considerably greater than some characteristic dimension of a typical nanostructure in the array. Such long-range order may be exhibited over a scale of distance several orders of magnitude greater than the characteristic dimension. The nanostructures in the array can be made from metals, semiconductors, or conducting or semiconducting polymers or other materials, as long as they have a different electron affinity than the material on the other side of a material junction (this pulls the electron away from the hole).

As used herein a "matrix" refers to a composition of matter in which two or more different arrays interdigitate, e.g., within the same layer. By way of example, the two different arrays may be different by virtue of being made from different materials, by virtue of having structures with different orientations, different sizes or some combination these.

Figure 1:
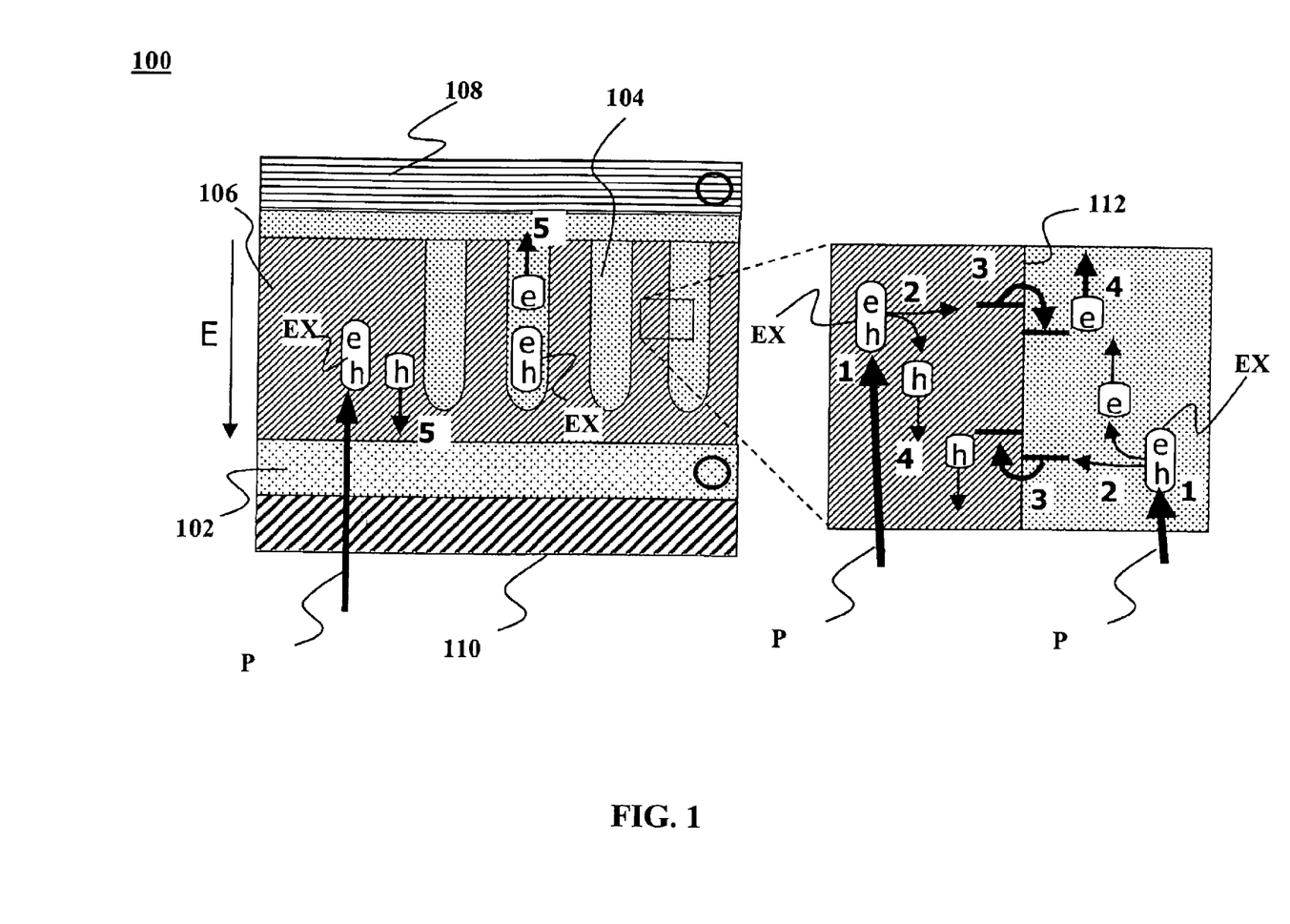
FIG. 1 shows a schematic of an example device according to an embodiment of the present invention.

An example of a device having the inventive solar cell architecture is depicted in FIG. 1. A solar cell device 100 implementing this architecture may comprise four primary layers: a transparent conducting or semiconducting electrode 102 through which light passes, a nanostructure layer having an array of conducting or semiconducting nanostructures 104 that absorb photons P and convert them into excitons EX (bound pairs of electrons and holes), a layer of conducting or semiconducting polymer 106 with a differential electron affinity relative to the nanostructures 104, and an electrode 108, e.g., made of aluminum, though which electrons migrate out of the solar cell. The transparent conducting or semiconducting electrode 102 may be made of a transparent conductive material, such as Indium Tin Oxide (ITO). The solar cell device 100 may be formed on a suitable transparent substrate 110 and hermetically sealed using techniques well known in the art, in order to prevent degradation from atmospheric contaminants such as water and oxygen.

By way of example, the nanostructure layer may include electron-transporting nanostructures 104 embedded in a hole-transporting polymer 106, as shown in the inset in FIG. 1. The operation of the device 100 generally proceeds as follows. Photons P incident on the nanostructures 104 and the polymer 106 produces excitons (electron-hole pairs) EX at 1. The excitons EX diffuse through the nanostructures and polymers at 2. Before some of the excitons EX can recombine, they cross the interface 112 between the nanostructures 104 and the polymer 106. At 3 Holes h are transferred across the interface 112 to the polymer 106 and electrons $e^-$ are transferred across the interface 112 to the nanostructures 104. At 4 the holes h and electrons e are respectively transported through the hole transporting polymer 106 and electron transporting material of the nanostructures 104. At 5, the electrode 108 collects the electrons $e^-$ and the transparent conducting or semiconducting electrode 102, collects the holes h producing a potential difference between the electrode 108 and the transparent conducting or semiconducting electrode 102 and a corresponding electric field E.

By way of example, and without limitation, the nanostructures 104 may include electron-accepting buckminsterfullerene ($C_{60}$) and the polymer 106 may be a hole-accepting material, e.g., a conducting or semiconducting polymer such as poly(2-methoxy-5-(2-ethyl-hexyloxy)-1,4-phenylene vinylene (MEH-PPV). A Material other than a polymer may be used in place of the polymer 106 provided the material has an electron affinity that is different from the electron affinity of the material of the nanostructures 104. The $C_{60}$ may be deposited in the pores of a mesoporous template or embedded within a matrix.

Although the nanostructures 104 are described above as electron-transporting and the polymer 106 as hole-transporting, the solar cell device 100 may alternatively have an inverse structure, i.e., with hole-transporting materials embedded in an electron transporting material.

In one embodiment the orientation of the solar cell active materials, e.g., the nanostructures 104, is determined by use of a mesoporous template, e.g., a pre-deposited layer of surfactant-templated, high-porosity thin films that act as a mold for the deposition of the other solar cell materials. The nanostructures 104 may be formed, e.g., by electrodeposition of metals, or solution-based deposition of conducting or semiconducting polymers, semiconductors or other materials into the pores of the mesoporous template for use in the solar cell.

By way of example, the nanostructures 104 may be in the shape of columns that are arrayed in a matrix. Alternatively, the nanostructure array may be an array of spheres or spheroidal objects arranged in a regular matrix, an array of ovoid or elongate objects arranged in a regular matrix, or an interdigitated network of semiconductor metal embedded within organic material/polymer. The exact shape of the nanostructures is often relatively unimportant. What is relatively important is that the nanostructures be substantially uniformly oriented and regularly arrayed with a separation distance between adjacent nanostructures in the array on the order of about 1 to about 100 nm, more preferably about 1 nm to about 25 nm and most preferably about 5 nm to about 15 nm.

There are several approaches to forming the nanostructures a solar cell or other optoelectronic device of the type shown in FIG. 1. By way of example, a mesoporous template may be prepared using a method to prepare high-porosity, mesophase structures and subsequent thin films with controlled pore structure and surface chemistry where the porosity is greater than approximately 50%. A hybrid mesoporous thin film incorporates inorganic, organic or composite molecules into the mesophase structure of the formed material. Embodiments of the present invention include a method for forming a liquid material that can be used to form highly porous thin films by such standard methods as dip-coating, spray-coating, spin-coating, or web coating. The hybrid mesoporous thin film may contain pores having diameters between about 5 nm and about 50 nm.

In the liquid phase, a precursor sol, a solvent, and water are mixed with a hydrophobic polymer, soluble in the solvent, and with a surfactant, wherein importantly the initial surfactant concentration, $c_0$, is less than the critical micelle concentration, cmc. Because the surfactant concentration is less than the critical micelle concentration, subsequent solvent evaporation induces micellization, incorporation of hydrophobic polymers into the hydrophobic micellar interiors, and further assembly into hybrid materials. Evaporation of the solvent promotes stabilization of the polymer in microemulsions along with additional self-assembly of silica surfactant mesophases so that a thin film can be formed on a substrate. The hydrophobic polymer aids in the self-assembly process, serving as a swelling agent to form a high-porosity structure. Subsequent calcination of the thin film can result in a hierarchical mesostructure composed of pores templated by both microemulsions and surfactant liquid crystalline assemblies with the thin films having a porosity of greater than approximately 50%. Highly porous thin films are attractive in applications requiring low dielectric constant materials, low refractive index, and low thermal conductivity.

Precursors such as alkoxysilanes or metal alkoxides, including titanium butoxide, titanium iso-propoxide, zirconium n-butoxide, aluminum iso-propoxide, aluminum iso-propoxide, and mixtures thereof, and organoalkoxysilanes when dissolved in a polar solvent and hydrolyzed under basic, acidic, or neutral conditions are useful for a sol material used in the present invention.

In one example, a homogeneous solution of a hydrophobic soluble polymer, a silica sol using an alkoxysilane $(Si(OR)_4$ in a solvent and a surfactant is prepared, wherein importantly the initial surfactant concentration, c, is less than the critical micelle concentration, cmc. Typical hydrophobic polymers include polypropylene oxide and polypropylene glycol dimethylacrylate. Typical alkoxysilanes include tetramethylorthosilicate, tetraethylorthosilicate, titanium butoxide, titanium iso-propoxide, zirconium n-butoxide, aluminum iso-propoxide, aluminum iso-propoxide and mixtures thereof. Organoalkoxysilanes include methyltrimethoxysilane, methyltriethoxysilane, and other $R'Si(OR)_3$ compounds where R' is an alkyl group, those with fluorinated groups, such as tridecafluoro-1,1,2,2,-tetrahydrooctyltriethoxysilane (TFTS), and compounds with mercapto-terminated groups, such as mercaptopropyl-trimethoxylsilane.

The surfactant can be anionic, cationic, nonionic, or a block copolymer. Anionic surfactants that can be used include, but are not limited to, sulfates, sulfonates, phosphates, and carboxylic acids. Cationic surfactants that can be used include, but are not limited to, alkylammonium salts, gemini surfactants, cetylethylpiperidinium salts, and dialkyldimethylammonium. Nonionic surfactants that can be used, with the hydrophilic group not charged, include, but are not limited to, primary amines, poly(oxyethylene) oxides, octaethylene glycol monodecyl ether and octaethylene glycol monohexadecyl ether. The solvent used is generally a polar organic/water solvent and can be any general polar organic solvent soluble in water, such as an alcohol/water solvent, a formamide/water solvent or a tetrahydrofuran/water solvent.

Because the surfactant concentration is less than the cmc, subsequent solvent evaporation induces micellization, incorporation of hydrophobic polymers into the hydrophobic micellar interiors and further assembly into hybrid silica-surfactant materials. When the solvent evaporation is accomplished by spin-coating, spray-coating or dip-coating and the films are calcined to remove the surfactant and polymer while preserving organo-silicon bonds, a porous thin film is formed on a substrate with a narrow size distribution of pores templated by the microemulsions and surfactants. This can be accomplished by using a low-temperature heat treatment or washing procedure.

Because solvent extraction techniques can collapse the mesoporous network, surfactant molecules are removed by a low temperature pyrolysis procedure wherein the films are heated in an inert atmosphere to a temperature sufficient to decompose the surfactant molecules (e.g., 250° C.) without degrading any covalently-bound organic ligands. This heat treatment also promotes further condensation of the silica framework, helping to stabilize the mesoporous network.

In one preparation to form thin films, a silica sol was prepared from tetraethylorthosilicate (TEOS), a polar organic solvent, water and an acid, a hydrophobic compound such as polypropylene oxide (molecular weight of approximately 2000) and a surfactant, such as a polyoxyethylene ether or a block polymer of the general formula, $HO(CH_2CH_2O)_n (CH_2CHCH_3O)_m (CH_2CH_2O)_nH$, referred to hereafter as P123. The subscripts m and n are integers. In one example, n is 20 and m is 70. The polar organic solvent can be any solvent that solubilizes the other reactants, particularly such solvents as alcohols, and more particularly, methanol, ethanol, propanol, butanol, tetrahydrofuran, and formamide or mixtures thereof.

In one example, an initial silica sol was prepared by refluxing tetraethylorthosilicate (TEOS), ethanol, water and an acid, such. as HCl, at approximately 60° C. The molar ratio of the TEOS, ethanol and acid was $1:3.8:1.5 \times 10^{-5}$. The sol was cooled to room temperature and surfactant, $CH_3 (CH_2)_{15} (OCH_2CH_2)_{10}$ OH, in amounts ranging from 0.6 g to 1.0 g, and the polymer, polypropylene oxide (PPO), in amounts ranging from approximately 0 g to 1.2 g, were added to 5 mL of the sol, along with 0.8 mL of 1N HCl. The sols were filtered and a thin film was prepared from this solution by spin-coating onto a substrate. During the coating procedure, evaporation of the solvent causes the formation of surfactant-stabilized polypropylene microemulsions incorporated into a surfactant-templated silica material. The coated films were heated to approximately 400° C. to 450° C. for approximately 3 hours to remove surfactant and polypropylene oxide templates.

Table I shows a summary of the resulting film properties, including capacitance, dielectric constant, refractive index, and film thickness, obtained by varying amounts of the surfactant and hydrophobic polymer. X-ray diffraction analysis indicated that the films, for which phase separation did not occur, were ordered. For example with 1 g of surfactant and 1 g of polymer, the resulting film had a 5.4 nm d-spacing before calcination and a 3.7 nm d-spacing after calcination. The refractive index was measured to be approximately 1.1 and the film thickness was approximately 1.4 micrometers. The porosity was approximately 80%.

TABLE I

| | Amount of Surfactant | Amount of PPO | | | | | |
|---|---|---|---|---|---|---|---|
| | | 1.2 g | 1.0 g | 0.8 g | 0.6 g | 0.4 g | 0 g |
| Capacitance (pF) | 1 g | 14 | 18 | 21 | 26 | 34 | 60 |
| Dielectric constant | 1 g | 1.4 | 1.5 | 1.6 | 2.0 | 2.4 | NA |
| Refractive index | 1 g | 1.1 | 1.1 | NA | 1.2 | 1.2 | NA |
| Film thickness (μm) | 1 g | 2.0 | 1.4 | 1.2 | 1.2 | 1.1 | NA |
| Capacitance (pF) | 0.8 g | PS | 15 | 19 | 22 | 30 | 52 |
| Dielectric constant | 0.8 g | PS | 1.5 | 1.3 | 1.5 | 2.0 | NA |
| Refractive index | 0.8 g | PS | NA | NA | 1.1 | 1.2 | NA |
| Film thickness (μm) | 0.8 g | PS | 1.8 | 1.2 | 1.1 | 1.0 | 0.9 |
| Capacitance (pF) | 0.6 g | PS | PS | 17 | 21 | 27 | 51 |
| Dielectric constant | 0.6 g | PS | PS | 1.5 | 1.7 | 1.8 | 3.2 |
| Refractive index | 0.6 g | PS | PS | 1.1 | 1.2 | 1.2 | 1.3 |
| Film thickness (μm) | 0.6 g | PS | PS | 1.6 | 1.3 | 1.0 | 0.8 |

NA—not available.
PS—phase separation occurred.

In another example, a silica sol was prepared as previously described with surfactant P123 in amounts ranging from 0.6 g to 1.2 g, and PPO in amounts ranging from 0.8 g to 1.2 g, added to 5 mL of the sol, along with 0.8 mL of 1N HCl. The sols were filtered and a thin film was prepared from this solution by spin-coating onto a substrate. During the coating procedure, evaporation of the solvent causes the formation of surfactant-stabilized polypropylene microemulsions incorporated into a silica-surfactant thin film material. The as-coated films were heated to approximately 400° C. to 450° C. to remove surfactant and polypropylene oxide templates. Table II shows a summary of the resulting properties, including capacitance, dielectric constant, refractive index, and film thickness, of the thin films using varying amounts of the surfactant and hydrophobic polymer.

TABLE II

| | Amount of Surfactant | Amount of PPO | | |
|---|---|---|---|---|
| | | 1.2 g | 1.0 g | 0.8 g |
| Capacitance (pF) | 1.2 g | 20 | 17 | 21 |
| Dielectric constant | 1.2 g | 1.3 | 1.3 | 2.2 |
| Refractive index | 1.2 g | 1.2 | 1.1 | 1.1 |
| Film thickness (μm) | 1.2 g | 0.9 | 1.0 | 1.3 |
| Capacitance (pF) | 1 g | 17 | 18 | 23 |
| Dielectric constant | 1 g | 1.2 | 1.1 | 2.1 |
| Refractive index | 1 g | 1.2 | 1.1 | 1.1 |
| Film thickness (μm) | 1 g | 20.8 | 1.2 | 1.2 |
| Capacitance (pF) | 0.8 g | PS | PS | PS |
| Dielectric constant | 0.8 g | PS | PS | 1.7 |
| Refractive index | 0.8 g | PS | PS | 1.2 |
| Film thickness (μm) | 0.8 g | PS | PS | 1.1 |
| Capacitance (pF) | 0.6 g | PS | PS | 25 |
| Dielectric constant | 0.6 g | PS | PS | PS |
| Refractive index | 0.6 g | PS | PS | PS |
| Film thickness (μm) | 0.6 g | PS | PS | PS |

PS—phase separation occurred.

The results shown in Tables I and II suggest that an increase in the concentration of the polymer PPO generally leads to a lower refractive index and lower dielectric constant as well as a higher porosity. When the surfactant concentration is too low relative to the concentration of the polymer, phase separation can occur.

In another example, a silica sol was prepared from tetraethylorthosilicate (TEOS), a polar organic solvent, water and an acid, and a surfactant, such as a polyoxyethylene ether. A hydrophobic polymer, polypropylene glycol dimethylacrylate can be added and a thin film can be prepared by coating onto a substrate during which time evaporation of the solvent occurred. The thin film is heated to remove surfactant and polymer.

In another example, added to the mixture of the sol, the soluble hydrophobic polymer and the surfactant, is an inorganic or organic compound, which is hereafter referred to as an interstitial compound, that is organized during the micellization into the mesophase structure by either covalent bonding in the porous structure or physically entrapment within the porous structure. Interestingly, these interstitial molecules can be larger than the pore sizes of the mesoporous structure, with the formed porous mesophase conforming around these molecules to form an essentially defect-free mesophase structure while still a retaining narrow pore size distribution and relatively high porosity and surface area. The interstitial compounds include, but are not limited to, organoalkoxysilanes, proteins, dyes, and metal-containing compounds. Any organoalkoxysilane compound can be used but certain compounds are useful for their specific functionality. For example, organoalkoxysilanes with fluorinated groups, such as tridecafluoro-1,1,2,2,-tetrahydrooctyltriethoxysilane (TFTS), make the film hydrophobic and compounds with mercapto-terminated groups, such as mercaptopropyltrimethoxylsilane, can absorb heavy metals. The organoalkoxysilane molecules are covalently bonded to the pores in the present invention to achieve desired functionality. Other interstitial compounds include mercaptopropyltrimethoxylsilane, rhodamine B, cytochrome c, 3-(2,4-dinitrophenylamino)propyl(triethoxy)silane. The presence of these inorganic and organic compounds in the hybrid porous mesophase structure of the present invention allow these materials to be used in sensor applications, as low dielectric constant films, as photonic materials and as optical hosts.

Additional information on methods for making surfactant-templated, high porosity thin films may be found in U.S. Pat. No. 6,270,846, the disclosures of which are incorporated herein by reference.

Alternative Fabrication of the Polymeric Mold or Template Structure

Mesoporous structures containing pores in a size range useful for the present invention can be alternatively be fabricated using a multi-layered, dip coating process. Alternatively, the reactants to form the mesoporous structures can be deposited using an inkjet-like deposition. The dip coating or spray coating or web coating process is advantageous from the standpoint of simplicity of manufacture. The inkjet-like deposition is advantageous from the standpoint of forming intricate device structures at low temperatures. Both techniques have separate and distinct advantages with regard to the nature of the formation of a mesoporous structure, as well as with regard to incorporation of the additional components of the solar cell devices.

Advantageously, one or more luminscent dyes can be added to any of these mixtures using the techniques described below. Such dyes may be used to absorb any incoming solar photons that are at wavelengths unsuited for conversion with the solar cell devices of this invention, and to reradiate such energy at wavelengths more suitable for efficient conversion of such incident energy to solar power.

In one example, among others, of the dip-coating process, a substrate is first coated with ethoxy polysiloxane surfactants in an ethanol solution. Upon removal from the dipping solution, the ethanol evaporates within 60–120 seconds. As evaporation proceeds, the molecules with a siloxane-surfactant micelle rearrange themselves to minimize their collective energy level. This process continues as the molecules further rearrange their nanoscale organization into highly regular liquid-crystalline mesophases. The resulting mesoporous films contain a high and tunable density of regular pores spaced in 5 nm repeating patterns, with pore diameters of 5 nm. Such a process may achieve variability in pore diameter of less than 2%. The resulting nanoscale architecture is highly reproducible, and can be permanently fixed by heating. The resulting nanoscale architecture is extremely stable and mechanically robust.

To produce mesoporous thin films, ethoxy polysiloxane surfactants can be added in requisite amounts to achieve an initial surfactant concentrations ranging from 0.004 to 0.23M, well below the critical micelle concentration (cmc), so the starting sols will have mesoscale homogeneity.

To fabricate self-assembling nanocomposite films, preferential ethanol evaporation concentrates the sol in water, non-volatile surfactant, and the siloxane species. By choosing the initial acid concentration to impede the competing process of siloxane condensation, the progressively increasing concentration of surfactant drives the self-assembly of polysiloxane-surfactant micelles and their further organization into liquid-crystalline mesophases. Such techniques are described, e.g., in Lu et al., "Continuous Formation of Supported Cubic and Hexagonal Mesoporous Films by Sol-Gel Dip-Coating", *Nature* 389: 364–368 (1997); and Lu et al., "Self-Assembly of Mesoscopically Ordered Chromatic Polydiacetylene Nanocomposites", *Nature* 410: 913–917, (2001), both of which are incorporated herein by reference.

The final reactant molar ratios are 1 TEOS: 22 $C_2H_5OH$: 5 $H_2O$: 0.093–0.31 surfactant: 0.039–0.8 organosilanes: $2.6 \times 10^{-5}$ organic derivatives. The highly-ordered structure of the resulting liquid crystallites will be permanently fixed through exposure to heat. After pattern deposition and drying, the surfactant templates will be selectively removed by calcinations in a nitrogen atmosphere at a temperature (~350° C.) sufficient to decompose the surfactant molecules.

Figure 2A:
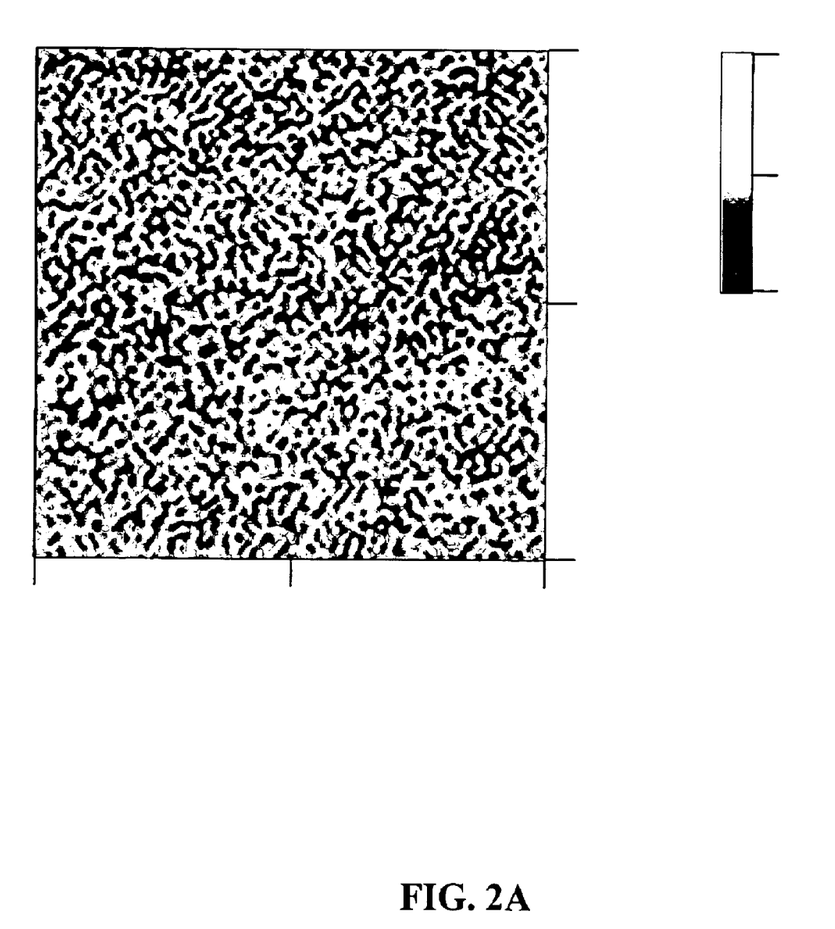
FIGS. 2A–2B depict atomic force micrographs of an example of a surfactant-templated porous film suitable for use with embodiments of the present invention.
Figure 2B:
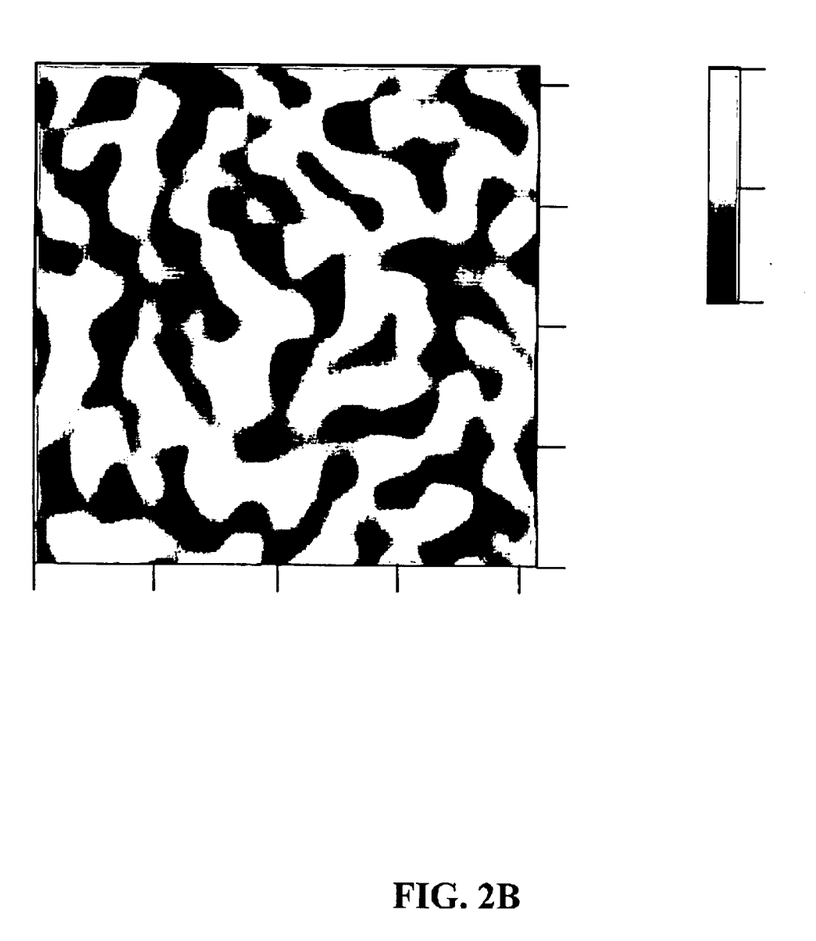

FIGS. 2A–2B depict atomic force micrographs of an example of a surfactant-templated porous film manufactured using techniques of the type described above. In this particular example, a porous film of $SiO_2$ was formed on an $F:SnO_2$ coated glass substrate using a sol mixture containing TEOS, Pluronic P123 as a surfactant, HCl as a condensation inhibitor, water and ethanol. The sol was filtered and a thin film was prepared from this solution by dip-coating onto a glass substrate. Prior to dip-coating, the substrate was cleaned and then dried by rinsing with isopropyl alcohol (IPA). FIGS. 2A–2B show phase contrast images, taken in tapping mode, of a nano-structured $SiO_2$ surface with features of about 10 nm diameter. The images have been modified to reduce noise and enhance contrast. Phase contrast is associated with changes in the viscoelastic properties. For example, small phase, indicated by the darker areas of the images, typically indicates the presence of a soft material. A relatively large change in phase, indicated by the lighter shaded areas in the images, may be associated with the presence of pores filled with air.

Alternatively, a mesoporous template for the nanostructures 104 may be produced using, e.g., intercalation and/or grafting of organic or polymeric molecules within a mineral lamellar network; synthesis by electrocrystallisation of hybrid molecular assemblies; impregnation of preformed inorganic gels, synthesis from heterofunctional metallic alkoxides or silsesquioxannes, synthesis of hybrid molecular assemblies through the connection of well defined functional nanobuilding blocks, templated growth of inorganic or hybrid networks using organic molecules and macromolecules including surfactants, amines, alkyl ammonium ions, or amphiphilic molecules, as structure directing agents, templated growth with nanoparticles followed by removal of the nanoparticles.

In addition, the mesoporous template may be fabricated by bioengineered self-assembly. One example, among others, of bioengineered self-assembly, may use a one-, two-, or three-dimensional protein array to serve as a scaffolding template for the ordered deposition/application of metals, metal oxides, and/or semiconducting materials, alone or in blends, so that each protein molecule is typically attached to at least one nanostructured metal or metal oxide particle. Such protein arrays can also be used as molds, and then destroyed, e.g., using a protease, after metal or metal oxide deposition has occurred.

Integration of Semiconducting Nanostructures by Electrodeposition

Several alternatives can be followed to synthesize or to place semiconductor materials and/or other nanostructures within the mesoporous thin film substrate. For example, the nanostructures can be electroplated using the mesoporous organic template as a plating mold. The mesoporous template itself may be used to modulate the electric field lines such that they create a selective deposition of metal or other material within the pores. Electrical contact can be made to the device substrate, which has conductive leads in contact with the active solar cell areas. As a general example, techniques for CdSe, CdTe, CdS, $TiO_2$, ZnO, $ZrO_2$, CuO electroplating are well known in the literature. An electrical potential difference is applied between an electrode immersed in the plating solution and the substrate, also immersed in the plating solution. Advantageously, a pulsed plating technique can be used wherein the potential difference is varied in a periodic fashion to tailor the crystallite sizes of the nanostructured materials as they are grown, in order to enhance crystallinity, enhance adhesion of the nanostructures, decrease interface traps, and decrease material stresses.

By way of example, and without limitation, metal oxide may be electrodeposited from a metal lactate solution on a conducting substrate at room temperature. The metal lactate solution may be prepared by addition of metal sulfate (1 eq, 2.25 g) to a solution containing lactic acid (2.4 eq., 1.95 g) and 3 mls water. Slowly, 5M sodium hydroxide (6 mls) may then be added to the solution and the, reaction may be allowed to stir for 2–12 h. After this time the pH of the solution may be adjusted to 9.0. Electrodeposition occurs at the working electrode by maintaining a constant voltage of 1.0 V relative to a Pt reference electrode. Voltage or metal concentration can be adjusted to alter the electrodeposition rate.

As set forth above, the nanostructures 104 may be formed by electrodeposition of metals, conducting or semiconducting polymers, semiconductors or other materials into the pores of the mesoporous template. Electrochemical, solution-based deposition methods provide a more attractive alternative approach, particularly for depositing metal structures, because of the high degree of control that can be achieved by varying the electrode potential. In electrodeposition, control of current allows control of the rate of deposition and, consequently, control of the morphology of the resulting film. Electrodeposition also avoids the need for high temperatures, high pressures, or vacuum, which can greatly reduce the cost of the resulting structures.

Figure 3A:
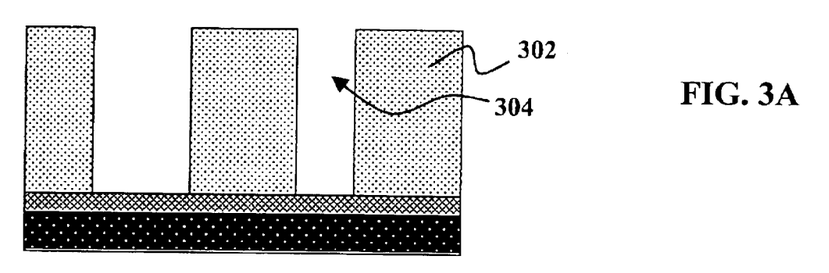
FIGS. 3A–3C show a series of cross-sectional diagrams illustrating electrodeposition of semiconducting nanostructured materials in a matrix of porous conducting or semiconducting polymeric materials.
Figure 3B:
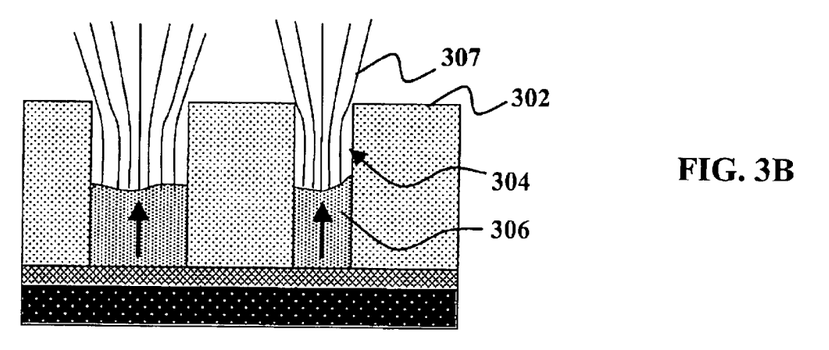
Figure 3C:
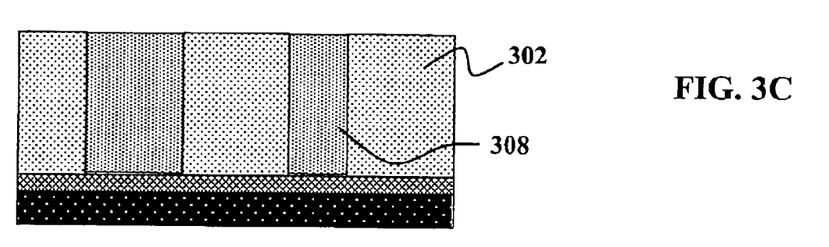

FIGS. 3A–3C depict a sequence of cross-sectional diagrams illustrating electrodeposition of material into the pores of a mesoporous template. FIG. 3A shows a cross-section of a "molecular breadboard" in the form of a mesoporous template 302 having nanopores 304. The mesoporous template 302 may be made from a polymeric material. The nanostructures are substantially uniformly oriented and regularly arrayed with a separation distance between adjacent nanostructures in the array on the order of about 1 to about 100 nm, preferably about 1 nm to about 25 nm and most preferably about 5 nm to about 15 nm.

As shown in FIG. 3B, material 306, such as Cadmium Selenide (CdSe) is electrodeposited into the nanopores 304 in the mesoporous template 302. The localized electrodeposition rate is proportional to the localized current density. In FIG. 3B, lines of current 307 represent the localized current density. The more closely the lines of current 307 are spaced, the greater the localized current density. Where the mesoporous film 302 includes with deep pores 304 in a polymeric mold, the current density tends to be non-uniform proximate the nanopores 304, resulting in selective deposition in the nanopores 304. The selective deposition fills the nanopores 306 with the material 306 resulting an array of filled nanopores 308 as shown in FIG. 3C.

Figure 4A:
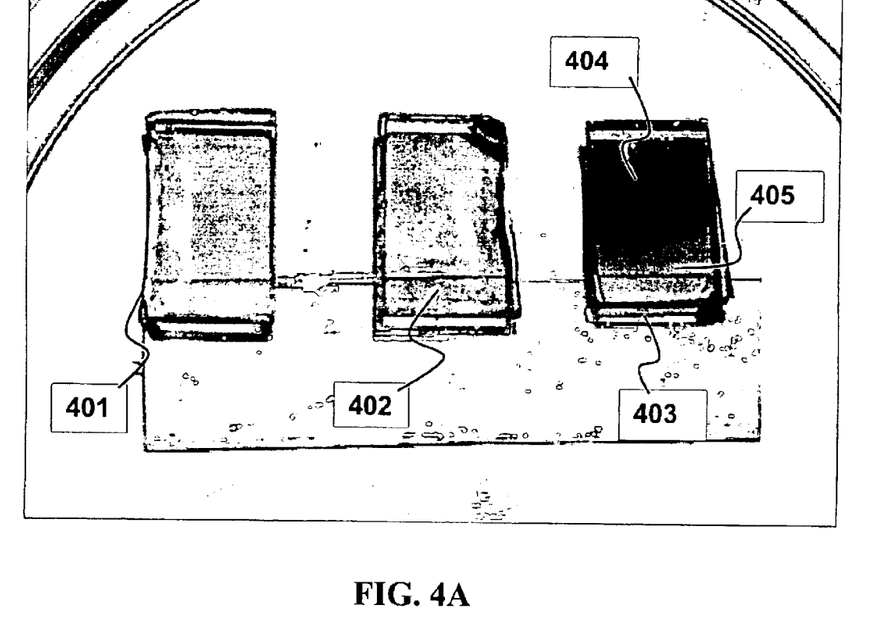
FIG. 4A shows three substrates used in an experiment to demonstrate deposition of material into pores in a mesoporous template.
Figure 4B:
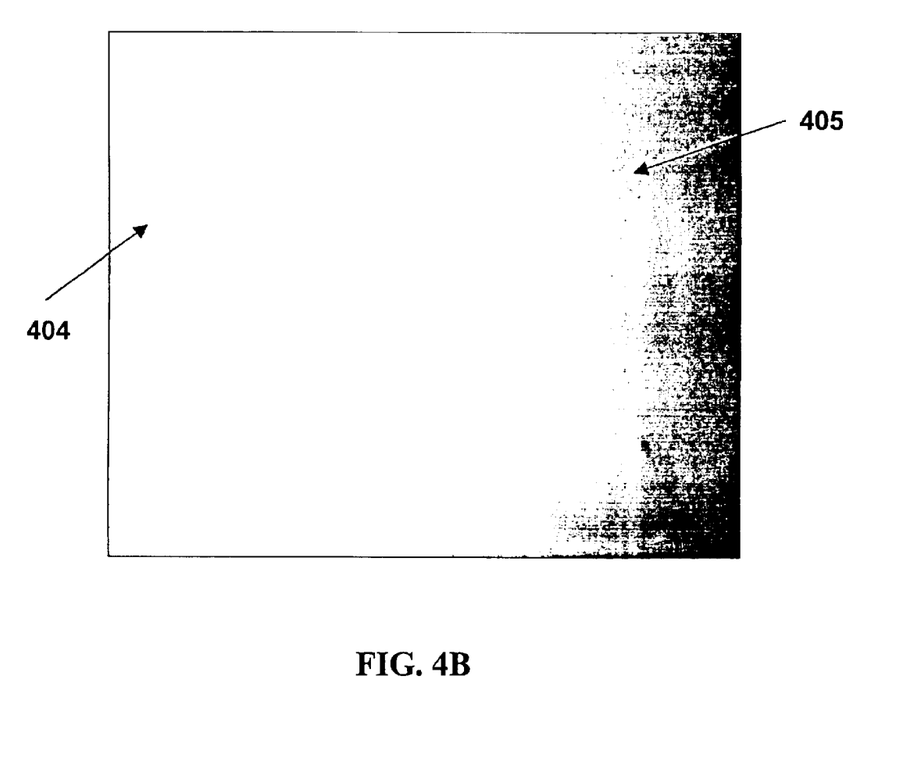
FIG. 4B is a magnified image of a portion of one of the substrates shown in FIG. 4A.

The inventors have utilized electrodeposition in an experiment to verify the pore structure in a mesoporous template. Electrodeposition was selected to verify that the pores were indeed continuous through the mesoporous template and made contact with the front and back surfaces. Relatively uniform deposition with a variety of materials into pores was accomplished with all mesoporous (MP) surfaces. FIG. 4A depicts three substrates that were used in the experiment. A first substrate 401 is uncoated fluorinated tin oxide (F:SnO$_2$). A second F:SnO$_2$ substrate 402, which served as a control, was coated with non-porous TEOS lacking a surfactant. A third F:SnO$_2$ substrate 403 was coated with a mesoporous template using TEOS and hexadecyl trimethylammonium bromide (CTAB) as a surfactant. Unmasked portions of the second substrate 402 and third substrate 403 were placed in an electrochemical bath and electric currents were applied. No metal deposition occurred on the second substrate 402. Metal deposition occurred in the pores of the mesoporous template on the third substrate 403 as indicated by the dark region 404 at the top of the third substrate 403 compared to a porous region 405 that was masked prior to deposition. The contrast between the unmasked porous region 404 and the masked porous region 405 is also clear from the magnified shown in FIG. 4B, which shows uniform deposition (color) across the surface.

Alternative Integration of Semiconducting Nanostructures into Solar Cell Devices A nanoporous substrate may optionally be used as a template for the solution-based, template-driven synthesis of CdSe nanostructures, which are electron-accepting and serve as the active layer of the plastic solar cell device. In one particular example, among others, the nanostructures are columns approximately 10 nm wide by 200 nm long. In another example, the nanostructures may be present in several size ranges, either in one layer or in multiple layers so that solar absorption is enhanced in several wavelength ranges through a "quantum dot" size effect.

Another alternative method for oriented deposition of the conducting or semiconducting nanostructured materials is to use an inkjet-like, spray coating or web coating deposition method. Deposition methods of this type are currently in use commercially for production of combinatorial arrays of bioactive compounds as well as electronic devices, magentic media, and photographic film, among other products. In the present invention, this method can be used to deposit some or all of the key materials of the active layer of the solar cell devices. Advantageously, the nanostructures can be deposited using this method, either as a codeposition with the precursors used to form the mesoporous organic template, or in a step subsequent to the formation of the mesoporous template.

Alternatively, conducting or semiconducting polymeric materials can be integrated with the mesoporous structure. Such materials include, e.g., poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly (thienylenevinylene) and derivatives thereof, and poly (isothianaphthene) and derivatives thereof, organometallic polymers, polymers containing perylene units, poly (squaraines) and their derivatives. By way of example and without limitation, mesoporous thin films containing, e.g., 5 nm pores can be fabricated with a conducting or semiconducting polymer such as P3HT (poly(3-hexylthiophene)) embedded within and significantly comprising a major component of the film. P3HT is an optically transparent material with a high electrical conductivity. Other materials that can be integrated into the mesoporous structure include pigments or dyes such as organic pigments or dyes, azo-dyes having azo chromofores (—N=N—) linking aromatic groups, phthalocyanines including metal-free phthalocyanine; (HPc), perylenes, naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f'] diisoquinoline-1,3,8,10-tetrone.

The above synthesis approaches for the mesoporous, conducting or semiconducting polymer-containing materials can be conducted using dip coating techniques or with inkjet-like co-deposition techniques to deposit the requisite materials on a suitable substrate for fabrication of the solar cell devices of this invention.

Integration of Conductors and Encapsulation

It is advantageous in a solar cell for electrically conductive (or semiconducting) materials to be present in close proximity to the photoactive materials in order to collect the photo-generated holes and electrons before they non-productively recombine. In one embodiment of the solar cell devices of this invention, conductive layers are placed above and below the layer(s) containing the photoactive materials. In another embodiment, such conductive materials can be present in one or more layers as fingers over, or embedded within, the active solar device layer(s).

To fabricate an organic solar cell, a transparent conducting or semiconducting layer is required to permit electron transport out of the solar cell. In one embodiment, a layer of Indium Tin Oxide (ITO) is deposited onto the device. A thin layer of Au can also be used—when thin enough (on the order of 100 Å in thickness), the Au is mostly transparent in the solar spectral range. Such layers also enhance the hermeticity of the device by providing a layer with significant resistance to moisture and oxygen.

The active layer of the solar cell device may not be stable without encapsulation. To stabilize the device, in one example, a 1 mm film of Tefzel®, can be adhered to the solar cell device via low-temperature lamination (fabrication may be performed in an nitrogen filled glove box to avoid exposing the final device to oxygen or moisture). Tefzel® is a material that provides mechanical strength and environmental resistance for the active layer of the solar cell. Tefzel® is a registered trademark of E. I. Du Pont de Nemours and Company of Wilmington, Del. A protective film, e.g., EVA can also be attached. EVA has anti-UV properties, in that it can block the transmission of light below 390 nm. A back electrode of 0.3 mm Aluminum foil can then be attached to provide for electrical lead attachment during device testing. Different suitable conducting materials can be used in place of the Aluminum foil.

Advantageously, solar cell devices within the scope of this invention can have texturing in one or more layers to enhance internal reflections and thus increase the path length for absorption of the photons by the photoactive materials. For example, the texturing can be on the side of the solar cell device that is closest to the incident solar energy. Alternatively, the texturing can be on the side of the solar cell farthest from the incident solar energy. Organic or other malleable layers of the solar cell device can be textured by using an embossing process. Alternatively, an intentionally rough substrate may be used as a starting material for device manufacture. In one preferred embodiment, a substrate such as Kapton, a sheet form of polyimide, is used. Such a substrate can be further treated by wet chemical or plasma etching before device manufacture begins. Furthermore, the texturing can result from an intentional nonuniformity in thickness of the active solar cell device layer—for instance, from differing heights of the semiconducting nanostructured materials, or from their incorporation at differing heights within the solar cell device.

While the above is a complete description of the preferred embodiment of the present invention, it is possible to use various alternatives, modifications and equivalents.

What is claimed is:

1. A solar cell device, comprising:
   two or more materials having different electron affinities, the solar cell device being characterized by an architecture wherein the two or more materials are regularly arrayed and wherein the presence of the two or more materials alternates within distances of between about 1 nm and about 100 nm, wherein the architecture is characterized by a mesoporous template having a conducting or semiconducting inorganic media containing pores, wherein the pores are filled with a conducting or semiconducting polymer material having a different electron affinity than the surrounding conducting or semiconducting inorganic media.

2. The solar cell of claim 1 wherein the presence of the two or more materials alternates within distances of between about 1 nm and about 25 nm.

3. The solar cell of claim 2 wherein the presence of the two or more materials alternates within distances of between about 5 nm and about 15 nm.

4. A solar cell device, comprising:
   two or more materials having different electron affinities, the solar cell device being characterized by an architecture wherein the two or more materials are regularly arrayed and wherein the presence of the two or more materials alternates within distances of between about 1 nm and about 100 nm, wherein the two or more materials include $C_{60}$ and a conducting or semiconducting polymer material.

5. A solar cell comprising one or more regularly structured nanoscale arrays of nanostructures embedded within a matrix of conducting or semiconducting inorganic media, wherein the nanostructures have a different electron affinity than the conducting or semiconducting inorganic media, wherein the arrays of nanostructures embedded within the matrix are characterized by an architecture with a mesoporous template made of conducting or semiconducting inorganic media containing pores, wherein the pores are filled with conducting or semiconducting polymer materials, wherein the conducting or semiconducting polymer materials have a different electron affinity than the surrounding inorganic conducting or semiconducting media.

6. The solar cell of claim 5 wherein a separation distance between adjacent nanostructures in the one or more regularly structured nanoscale arrays is between about 1 and about 100 nm.

7. The solar cell of claim 6 wherein the separation distance between adjacent nanostructures in the one or more regularly structured nanoscale arrays is between about 1 nm and about 25 nm.

8. The solar cell of claim 7 wherein the separation distance between adjacent nanostructures in the one or more regularly structured nanoscale arrays is between about 5 nm and about 15 nm.

9. The solar cell of claim 5 wherein the arrays of nanostructures include an array of spheres or spheroidal objects arranged in a regular matrix, or an array of ovoid or elongate objects arranged in a regular matrix.

10. The solar cell of claim 5, wherein two or more different arrays interdigitate within the same layer.

11. The solar cell of claim 5 wherein the pores have diameters between about 5 nm and about 50 nm.

12. The solar cell of claim 11 wherein the mesoporous template is fabricated with a conducting or semiconducting polymer embedded within the template.

13. The solar cell of claim 5 wherein the conducting or semiconducting polymeric materials include a material chosen from the group of poly(phenylene) and derivatives thereof, poly(phenylene vinylene) and derivatives thereof, poly(2-methoxy-5-(2-ethyl-hexyloxy)-1,4-phenylene vinylene (MEH-PPV), poly(para-phenylene vinylene) (PPV)), poly(thiophene) and derivatives thereof, regioregular poly(3-octylthiophene-2,5,-diyl), regiorandom poly(3-octylthiophene-2,5,-diyl), regioregular poly(3-hexylthiophene-2,5-diyl), regiorandom poly(3-hexylthiophene-2,5-diyl), poly(thienylenevinylene) and derivatives thereof, poly(isothianaphthene) and derivatives thereof, organometallic polymers, polymers containing perylene units, and poly(squaraines) and their derivatives.

14. The solar cell of claim 5 wherein the conducting or semiconducting polymeric materials include P3HT (poly(3-hexylthiophene)).

15. The solar cell of claim 5 wherein the mesoporous template is fabricated with a pigment or dye embedded within the template.

16. The solar cell of claim 15, wherein the pigment or dye includes a material chosen from the group of organic pigments or dyes, azo-dyes having azo chromofores (—N=N—) linking aromatic groups, phthalocyanines including metal-free phthalocyanine(HPc)perylenes, naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f']diisoquinoline-1,3,8,10-tetrone.

17. The solar cell of claim 5, wherein the nanostructures are present in one or more size ranges.

18. The solar cell of claim 17 wherein the nanostructures are present in one or more layers.

19. The solar cell of claim 5 wherein the nanostructures further include $C_{60}$.

20. A method for making solar cells, comprising:
imposing an orientation on an array of two or more materials having different electron affinities, such that the two or more materials are regularly arrayed and the presence of the two or more materials alternates within distances of between about 1 nm and about 100 nm, wherein the two or more materials are characterized by an architecture with a mesoporous template having a conducting or semiconducting inorganic media containing pores, wherein the pores are filled with a conducting or semiconducting polymer material having a different electron affinity than the surrounding conducting or semiconducting inorganic media.

21. The method of claim 20 wherein the presence of the two or more materials alternates within distances of between about 1 nm and about 25 nm.

22. The method of claim 21 wherein the presence of the two or more materials alternates within distances of between about 5 nm and about 15 nm.

23. The method of claim 22 wherein the two or more materials include $C_{60}$ and a conducting or semiconducting polymer material.

24. The method of claim 20 wherein imposing the orientation on the array includes solution deposition of one of the two or more materials into a surfactant-templated, high-porosity polymeric mold structure.

25. The method of claim 20 wherein imposing the orientation on the array includes electrodeposition of one of the two or more materials into a surfactant-templated, high-porosity polymeric mold structure.

26. The method of claim 20 wherein imposing the orientation on the array includes using an external ordering field.

27. The method of claim 26 wherein the external ordering field is an electric field.

28. The method of claim 20, wherein imposing the orientation on the array includes forming a mesoporous template having an array of pores.

29. The method of claim 28 wherein forming the mesoporous template includes pre-depositing a layer of surfactant-templated, high-porosity thin films.

30. The method of claim 29, wherein the layer of surfactant-templated, high-porosity thin films act as a mold for the deposition of an active solar cell material.

31. The method of claim 29 wherein pre-depositing a layer of surfactant-templated, high-porosity thin films includes depositing one or more reactants by an inkjet deposition.

32. The method of claim 29 wherein the surfactant-templated, high-porosity thin films include one or more luminscent dyes.

33. The method of claim 32, wherein the dyes may absorb photons that are at wavelengths unsuited for conversion with the solar cells and reradiate energy at wavelengths more suitable for efficient conversion to solar power.

34. The method of claim 28, wherein forming the mesoporous-template includes using one or more techniques selected from the following group:

intercalation and/or grafting of organic or polymeric molecules within a mineral lamellar network, synthesis by electrocrystallisation of hybrid molecular assemblies, impregnation of preformed inorganic gels, synthesis from heterofunctional metallic alkoxides or silsesquioxannes, synthesis through the connection of well defined functional nanobuilding blocks, templated growth of inorganic or hybrid networks using organic molecules and macromolecules including surfactants, amines, alkyl ammonium ions, or amphiphilic molecules, as structure directing agents, and templated growth with nanoparticles followed by removal of the nanoparticles and bioengineered self-assembly.

35. The method of claim 28 wherein forming the mesoporous template includes bioengineered self-assembly.

36. The method of claim 35, wherein the bioengineered self-assembly includes using a one-, two-, or three-dimensional protein array to serve as a scaffolding template for the ordered deposition/application of metals, metal oxides, and/or semiconducting materials, alone or in blends.

37. The method of claim 36 wherein each protein molecule in the one-, two-, or three-dimensional protein array is attached to at least one nanostructured metal or metal oxide particle.

38. The method of claim 37 further comprising destroying the protein array after metal or metal oxide deposition has occurred.

* * * * *